# United States Patent
Shah et al.

(10) Patent No.: US 8,527,821 B2
(45) Date of Patent: Sep. 3, 2013

(54) HYBRID TEST COMPRESSION ARCHITECTURE USING MULTIPLE CODECS FOR LOW PIN COUNT AND HIGH COMPRESSION DEVICES

(75) Inventors: Malav Shrikant Shah, Bangalore (IN); Swathi Gangasani, Bangalore (IN); Srivaths Ravi, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/758,954

(22) Filed: Apr. 13, 2010

(65) Prior Publication Data

US 2012/0304031 A1    Nov. 29, 2012

Related U.S. Application Data

(60) Provisional application No. 61/168,818, filed on Apr. 13, 2009.

(51) Int. Cl.
*G01R 31/28*  (2006.01)
(52) U.S. Cl.
USPC .......................................... 714/726
(58) Field of Classification Search
None
See application file for complete search history.

(56) References Cited

U.S. PATENT DOCUMENTS

| | | | | |
|---|---|---|---|---|
| 7,512,851 | B2 * | 3/2009 | Wang et al. | 714/726 |
| 7,702,983 | B2 * | 4/2010 | Casarsa | 714/729 |
| 7,797,603 | B2 * | 9/2010 | Rajski et al. | 714/738 |
| 8,214,704 | B1 * | 7/2012 | Bertanzetti | 714/729 |
| 2007/0234163 | A1 * | 10/2007 | Mukherjee et al. | 714/736 |
| 2007/0283200 | A1 * | 12/2007 | Casarsa | 714/724 |
| 2008/0052586 | A1 * | 2/2008 | Rajski et al. | 714/741 |
| 2008/0256497 | A1 * | 10/2008 | Wohl et al. | 716/3 |
| 2008/0294953 | A1 * | 11/2008 | Cheng et al. | 714/726 |
| 2010/0138708 | A1 * | 6/2010 | Rajski et al. | 714/729 |
| 2010/0192030 | A1 * | 7/2010 | Kapur et al. | 714/726 |
| 2011/0231722 | A1 * | 9/2011 | Mukherjee et al. | 714/729 |

\* cited by examiner

*Primary Examiner* — Guerrier Merant
(74) *Attorney, Agent, or Firm* — Robert D. Marshall, Jr.; Wade James Brady, III; Frederick J. Telecky, Jr.

(57) ABSTRACT

This invention uses multiple codecs to efficiently achieve the right balance between compression and coverage for a given design. This application illustrates a simple example using two codecs including a high compression codec and a low compression codec. The test engineer generates a first set of test patterns using the high compression codec. If this high compression results in unacceptable fault coverage loss, the top-up patterns for additional coverage are generated using the low compression codec. The invention may use multiple codecs serially one after the other. The codecs can be of different types or parameters (such as compression ratio, debug tolerance and combinational codec versus sequential codec).

14 Claims, 5 Drawing Sheets

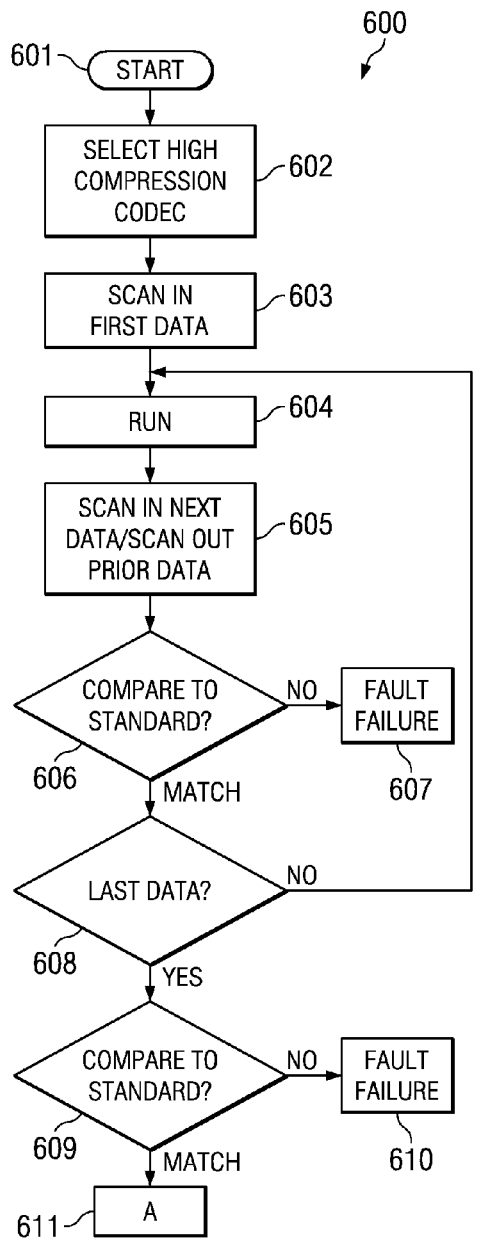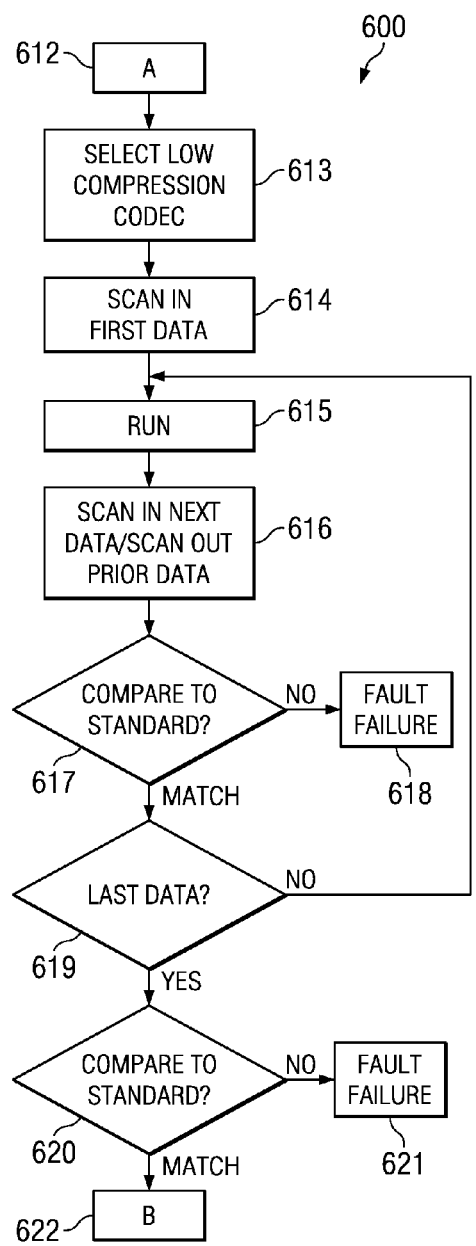
FIG. 6A
FIG. 6B

HYBRID TEST COMPRESSION ARCHITECTURE USING MULTIPLE CODECS FOR LOW PIN COUNT AND HIGH COMPRESSION DEVICES

CLAIM OF PRIORITY

This application claims priority under 35 U.S.C. 119(e)(1) to U.S. Provisional Application No. 61/168,818 filed Apr. 13, 2009.

TECHNICAL FIELD OF THE INVENTION

The technical field of this invention is integrated circuit production testing.

BACKGROUND OF THE INVENTION

Newly manufactured integrated circuits must be tested before they are shipped to customers. Integrated circuit manufacturing is just short of miraculous but defective parts can be produced. Integrated circuit manufacturers generally test every integrated circuit for compliance with the design guidelines. Most integrated circuit designs include scan data paths such as JTAG to input and output data on other than the circuits normal I/O ports. A typical technique includes entering a test pattern into the scan chain that places the integrated circuit in a known state. The device under test is then run normally for one or more machine cycles. The resulting data on the registers in the scan chain is read out and compared with expected results. Key factors in the cost of this testing is the amount of data to be transferred, tester time used and the extent of the operations covered by the test patterns used.

The amount of pattern data to be input and output is very large. Generally integrated circuits are manufactured with plural scan chains that can be loaded and read in parallel. Even with parallel scan chains the amount of data transferred is still large. One response to this data requirement is data compression. The tester sends compressed data to the device under test. The integrated circuit under test includes a decompressor to recover the original data for loading to a scan chain and a compressor for compressing the state data read out of the scan chain.

Multi-site testing using low test pin count and high compression techniques are commonly used techniques to reduce test time and test cost. High compression of test data can result in coverage loss due to the higher correlation in the test data loaded into scan flip-flops. A conventional response to such coverage loss includes using a no-compression mode or bypass mode automatic test pattern generation (ATPG). This uncompressed test pattern data covers the coverage loss of the highly compressed test pattern data. Empirical data shows this technique incurs a significant test time hit, defeating the objective of low test time.

The increasing push for reduced chip costs and test costs, make multi-site testing the de-facto test strategy. As the number of devices that can be tested in parallel increases, the number of tester I/O channels available for a single device decreases. These trends reduce the quality of manufacturing test for a single device. Reducing the number of scan channels requires an increase in the efficiency of compression which reduces coverage due to higher correlation between test data. This higher correlation restricts the type of patterns that can be generated and lowers coverage about 2 to 3% to an unacceptable level.

SUMMARY OF THE INVENTION

This invention uses multiple codecs to efficiently achieve the right balance between compression and coverage for a given design. This application illustrates a simple example using two codecs including a high-compression codec and a low-compression codec. The test engineer generates a first set of test patterns using the high-compression codec. If this high compression results in any fault coverage loss, the top-up patterns for additional coverage are generated using the low-compression codec.

In a first example design, the conventional solution using a high compression ratio and an uncompressed/bypass mode reduced the achieved compression ratio to just 4.91 times. This invention overcomes these limitations of the prior art. A low compression codec enables low compression mode for recovering test coverage. Since the low compression mode is more efficient than the prior art bypass mode in test time, coverage recovery is achieved with substantial test time savings. In the first example design, a two-pass coverage recovery includes a low compression codec followed by a bypass mode. This achieves a compression ratio of 10.71 times. This achieved compression ratio is more than twice the conventional achieved compression ratio.

This application describes an example using two codecs with compression ratio as the parameter for the codec. The invention includes using multiple codecs serially. The codecs of this invention have different types or parameters. The example of this application uses compression ratio as the parameter. Debug tolerance can be used as the parameter. Combinational codec versus sequential codec is another parameter.

BRIEF DESCRIPTION OF THE DRAWINGS

These and other aspects of this invention are illustrated in the drawings, in which:

FIGS. 6A, 6B and 6C together illustrate a process testing an integrated circuit according to this invention.

DETAILED DESCRIPTION OF PREFERRED EMBODIMENTS

This invention uses multiple codecs to achieve the right balance of compression and coverage for a given design. This application describes a simple example of this architecture having a dual codec architecture including one high-compression codec and one low-compression codec. The test engineer generates the first set of test patterns with the high-compression codec. If there is unacceptable fault coverage loss, the top-up patterns for additional coverage are generated using the low-compression codec.

This invention is not only applicable for low-pin count devices, but also for regular devices that target very high compression ratios such as 100 times. Commercial test compression solutions from EDA vendors become less efficient due to higher compression targets. The coverage loss that results is recovered using a low-compression codec. The benefits of this invention will be explained below in conjunction with two exemplary designs.

Figure 1:
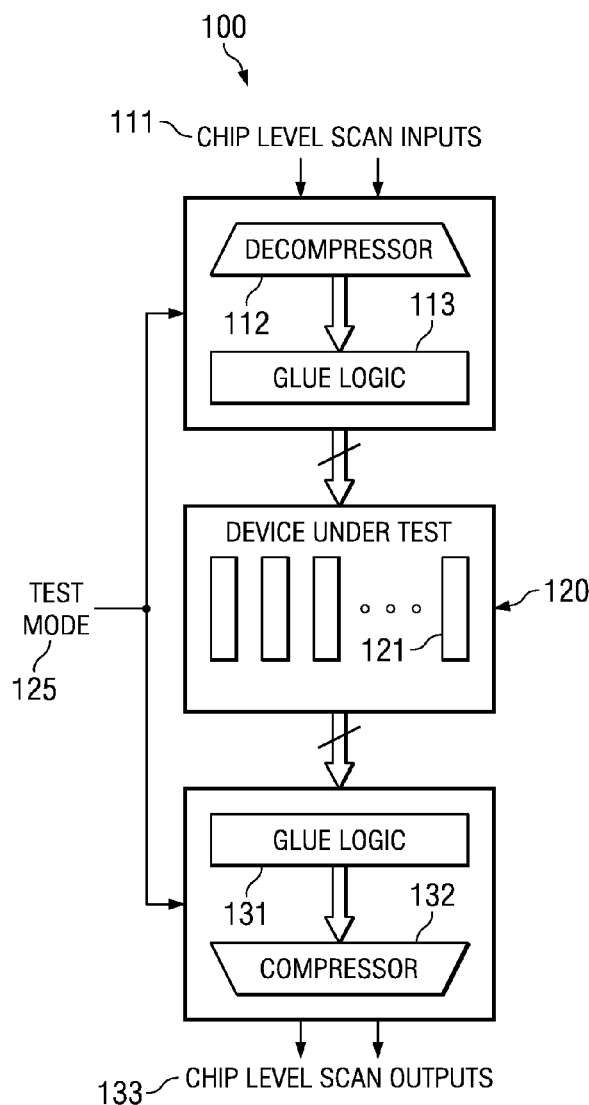
FIG. 1 illustrates a prior art high compression technique.

This application describes a test compression architecture DFTCMax from Synopsys. DFTCMax is a purely combinational compression solution. FIG. 1 illustrates the architecture 100 of DFTCMax. Note the parts illustrated in FIG. 1 are included in the manufactured integrated circuit. Architecture 100 includes a combinational decompression structure between the chip level scan pins 111 and the numerous short internal scan chains 121. Compressed scan input values are loaded in the DFTCMax module that distributes them internally through an association between an external scan pin and an internal scan chain.

Test compression architecture 100 includes decompressor 112. Decompressor 112 allows n chip level scan inputs 111 to be fanned out to m internal scan chains 121. In this example m and n define the compression and m>>n. Glue logic 113 supplies this decompressed test pattern data to device under test 120. Device under test 120 includes plural short internal scan chains 121 which receive the test pattern data.

Glue logic 131 receives the outputs of short internal scan chains 121 and supplies these to compressor 132. Compressor 132 includes mainly combinational XOR logic for compaction. Compressor 132 takes m internal scan outs from short internal scan chains 121 as inputs and converts them into n chip level scan outs 133.

Glue logic 113 and 131 is scan reconfiguration multiplexing logic. Glue logic 113 and 131 allow selection between compression and regular bypass ATPG modes based upon the state of test mode signal 125. Architecture 100 provides test time savings because m>>n. This permits test pattern data to be loaded and recalled from device under test 120 faster than permitted by chip level scan inputs 111 and chip level scan outputs 133.

The conventional modes of operation of the architecture 100 illustrated in FIG. 1 include compression mode and bypass mode. In compression mode all the flops in the device under test are stitched into multiple internal chains. Compression is achieved by fanning out top level external scan inputs to multiple shorter internal scan chains (stumps). Depending on the target coverage and test time, the number of internal stumps and the stump length varies. In bypass mode, codec structure is bypassed and all the flops in the design are stitched into top level scan chains with number equal to the top-level scan ports. A test mode signal 125 selects between the two modes and glue logic 113 and 131 takes care of scan chain reordering for the two modes based upon test mode signal 125.

The prior art approach illustrated in FIG. 1 used for the testing devices using compression has the following characteristics. This prior art technique uses a high compression mode with more internal scan chains followed by a bypass ATPG top-up. Table 1 notes the comparative results using this prior art technique in a first example design. This example design is a 32-bit microcontroller unit.

TABLE 1

| Test Technique | Fault Coverage | No. of Chains | Chain Length | Test Cycles | Achieved Compression |
|---|---|---|---|---|---|
| Stand-alone normal ATPG | 99.04% | 2 | 6900 | 14,020,800 | Reference |
| High compression mode | 97.49% | 90 | 150 | 513,900 | 27.28X |
| Bypass top-up mode | 99.05% | 2 | 6900 | 2,339,100 | 4.91X |

TABLE 1-continued

| Test Technique | Fault Coverage | No. of Chains | Chain Length | Test Cycles | Achieved Compression |
|---|---|---|---|---|---|
| Overall results | | | | 2,853,000 | 4.91X |

This first example design includes 2 scan ports which are fanned out to 90 internal chains. The number of scan ports is limited by pin limitations in the testing environment which supports testing 64 devices in parallel. Coverage obtained with the high compression of 27× was 97.49%. This was judged not sufficient to meet the coverage goals. In accordance with this prior art technique, top-up patterns are generated in 2 chain bypass ATPG top-up mode to recover the coverage loss. This additional testing reached an acceptable coverage of 99.05%. Because bypass chain length is huge, the test cycles and test time for this portion of the test increased drastically. This reduced the overall compression to less than 5× compared to the original compression of 27× achieved by high compression portion of the test, which was DFTCMax in this example. The overall achieved compression is greatly effected by the bypass top-up patterns. This substantially negates the advantage of test data compression. Similar results on other design examples are noted in Table 3 below.

Figure 2:
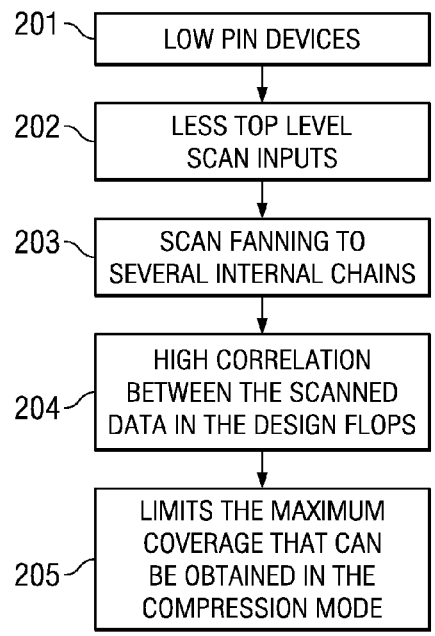
FIG. 2 illustrates the progression in design philosophy in the prior art technique of FIG. 1.
Figure 3:
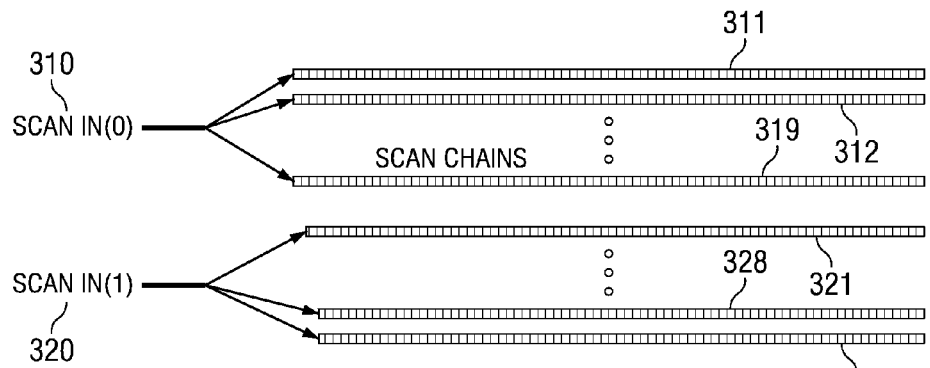
FIG. 3 illustrates a number of top level scan inputs requiring scan fanning to several internal scan chains according to the prior art of FIG. 1.

FIG. 2 illustrates the progression in design philosophy in this prior art technique. The design philosophy starts with a low pin device 201. Testing such a low pin device entails less top level scan inputs 202. This low number of top level scan inputs requires scan fanning to several internal scan chains 203. This is shown in FIG. 3. FIG. 3 illustrates two top level scan inputs Scan in(0) 310 and Scan in(1) 320. Data received on Scan in(0) 310 is fanned to plural scan chains 311, 312 . . . 319. Data received on Scan in(1) 320 is fanned to plural scan chains 321 . . . 328, 329. Using high compression causes high correlation between the scanned data in the design flip-flops 204. These factors lead to limits on the maximum coverage that can be obtained in the compression mode 205.

The limitations of this prior art technique are as follows. Meeting the coverage goals of >99% requires a bypass ATPG top-up mode without any compression. In low pin count devices where very few pins are available for testing, the total number of scan chains in the bypass ATPG mode is also limited. Thus all the design flip-flops must be stitched to very few scan chains (2 or 3). This makes the length of each scan chain one half or one third the number of design flip-flops. Less coverage in the high compression mode demands large number of top-up patterns to meet the coverage goals. This increases the test time as well as test data volume tremendously, almost nullifying the compression achieved earlier. A more desirable compression solution would work efficiently with fewer scan ports and require fewer top-up bypass patterns.

This invention is an efficient scheme to reduce the test time impact in low pin count devices (applicable even with regular devices targeting high compression), having higher coverage goals (>99%). To overcome the test time impact with the bypass patterns, the coverage loss is regained using an additional low compression mode. This invention includes another codec that supports lower compression having a smaller number of internal chains when compared to the higher compression codec.

Figure 4:
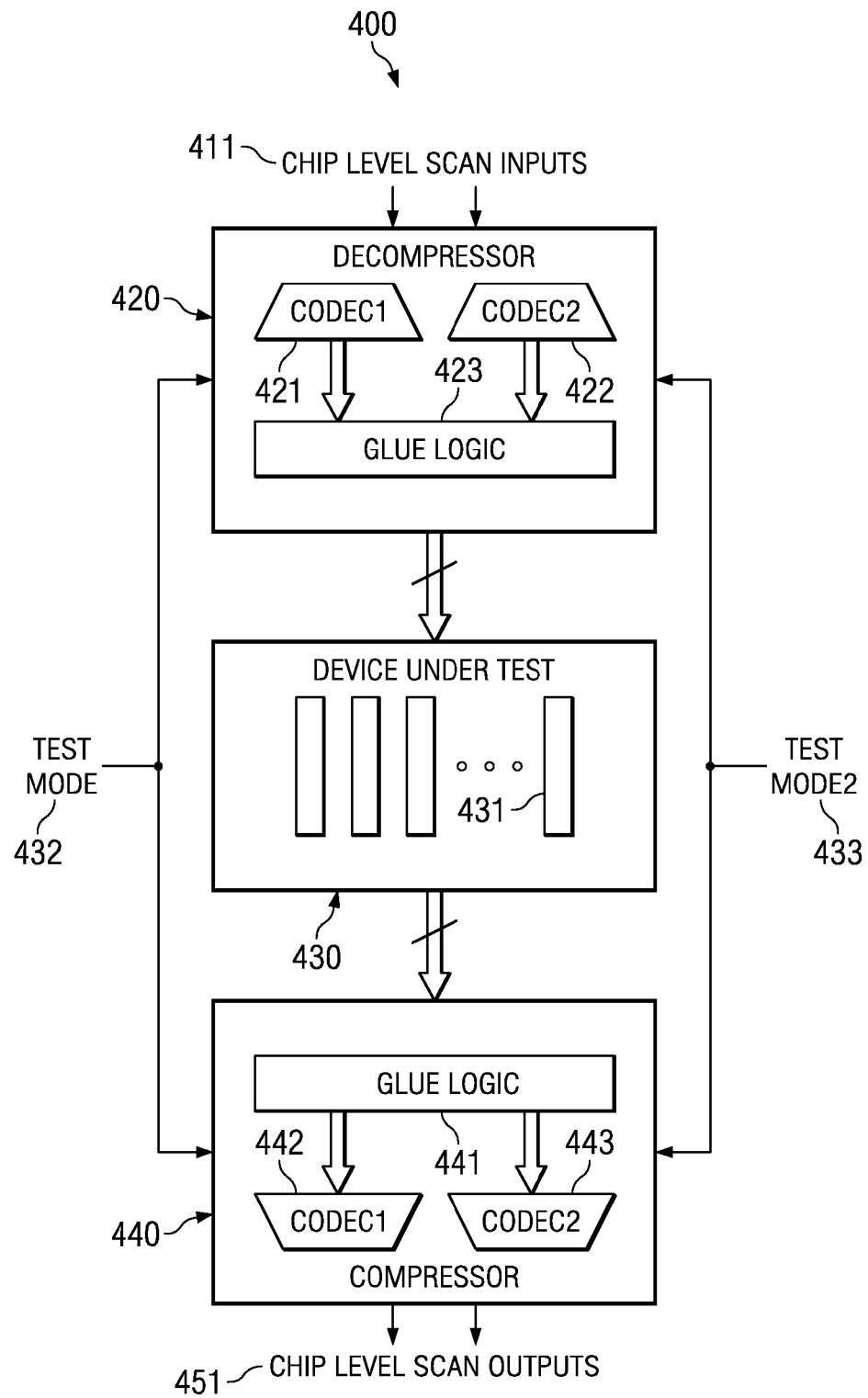
FIG. 4 illustrates a combination high compression and low compression technique of this invention.

FIG. 4 illustrates architecture 400 of this invention. The parts illustrated in FIG. 4 are included in the manufactured integrated circuit. Architecture 400 receives test pattern data via chip level scan pins 411. This input data is supplied to decompressor 420 constructed differently than shown in FIG. 1. Decompressor 420 allows n chip level scan inputs 411 to be fanned out to m internal scan chains 421. Decompressor 420 includes coded 421, codec2 422 and glue logic 423. Codec1 421 is a high compression codec. Codec2 423 is a lower compression codec. Glue logic 423 supplies this decompressed test pattern data from either coded 421 or codec2 422 to device under test 430. Device under test 430 includes plural short internal scan chains 431 which receive the test pattern data.

Compressor 440 included glue logic 441, coded 442 and codec2 443. Glue logic 441 receives the outputs of short internal scan chains 431 and supplies to one of coded 442 or codec2 443. The selected coded 442 or codec2 443 supplies output data on chip level scan outputs 451.

Glue logic 423 and 441 allow selection between two levels of compression and regular bypass ATPG modes based upon the state of test mode signal 432 and test mode2 signal 433. Comparing architecture 400 of FIG. 4 with architecture 110 of FIG. 1, architecture 400 may select between the two codecs having high or low compression. Signals test mode 432 and test mode2 433 control the selection of glue logic 423 and 441. Test mode signal 432 selects between compression mode and bypass mode. Test mode2 signal 433 selects between the high compression codec and the low compression codec. Scan reconfiguration for each compression mode is taken care by the corresponding glue logic.

As a first step coverage loss due to high compression/decompression in coded 421 and coded 442 is compensated by test data in a lower compression/decompression mode using codec2 422 and codec2 443. Any further coverage loss after the low compression mode can be recovered using the normal ATPG top-up mode without compression as in the prior art of FIG. 1. Very few normal ATPG patterns using the bypass mode will be required using this invention, thus enabling high overall compression.

Table 2 notes the results using this invention for the first example design. The invention includes a high compression mode with more internal chains followed by a lower compression mode with lesser internal chains followed by a bypass ATPG top-up test.

TABLE 2

| Test Technique | Fault Coverage | No. of Chains | Chain Length | Test Cycles | Achieved Compression |
|---|---|---|---|---|---|
| High compression mode | 97.49% | 90 | 150 | 513,900 | 27.28X |
| Low compression top-up | 98.78% | 15 | 899 | 318,246 | 16.84X |
| Bypass top-up | 99.05% | 2 | 6900 | 476,100 | 10.71X |
| Overall results | | | | 1,308,246 | 10.71X |

As shown in Table 1 the conventional high compression codec gives 97.49% coverage with a compression of 27× for this first example design. The invention uses a low compression codec for generating patterns for the remaining coverage rather than moving directly to a bypass top-up pattern as in the prior art illustrated in FIG. 1. For this first example design this attains 98.78% coverage. The final bypass top-up test data is needed for only a remaining 0.22% coverage rather than for a remaining 1.5% in the prior art case noted in Table 1. The final compression achieved with the invention for this first example design is 10.71× compared to only 4.91× using the prior art.

Table 3 notes a comparison between the prior art technique of FIG. 1 and the invention for three example designs. Table 3 shows that in the prior art approach the advantage of compression is greatly reduced due to ATPG top-up needed to attain additional fault coverage to reach a 99% stuck-at goal. In Table 3 all three designs had a 99% fault coverage goal. For the first example design a single codec dftcmax having a high compression of 27× yielded fault coverage of 97.49%. Adding a top-up 2 chain ATPG (2 chains are used because this example design uses a tester targeted for 64 multi-site test), the final compression is reduced to only 4.91×. Using the invention, fault coverage reaches 98.78% with the lower compression codec. Thus the final 2 chain ATPG was required only for the remaining 0.22% fault coverage leading to overall compression of 10.71×.

TABLE 3

| Design Example | Compression/ Fault Coverage by high compression codec | Existing Approach Final compression/Fault Coverage after ATPG top-up | Proposed Approach Final compression/Fault Coverage after lower compression codec and ATPG top-up |
|---|---|---|---|
| First | 27.28x/97.49 | 4.91x/99.05 | 10.71x/99.05 |
| Second | 45.5x/99.14 | 14.57x/99.64 | 37.77x/99.62 |
| Third | 26.3x/98.71 | 5.32x/99.64 | 15.87x/99.64 |

Figure 5:
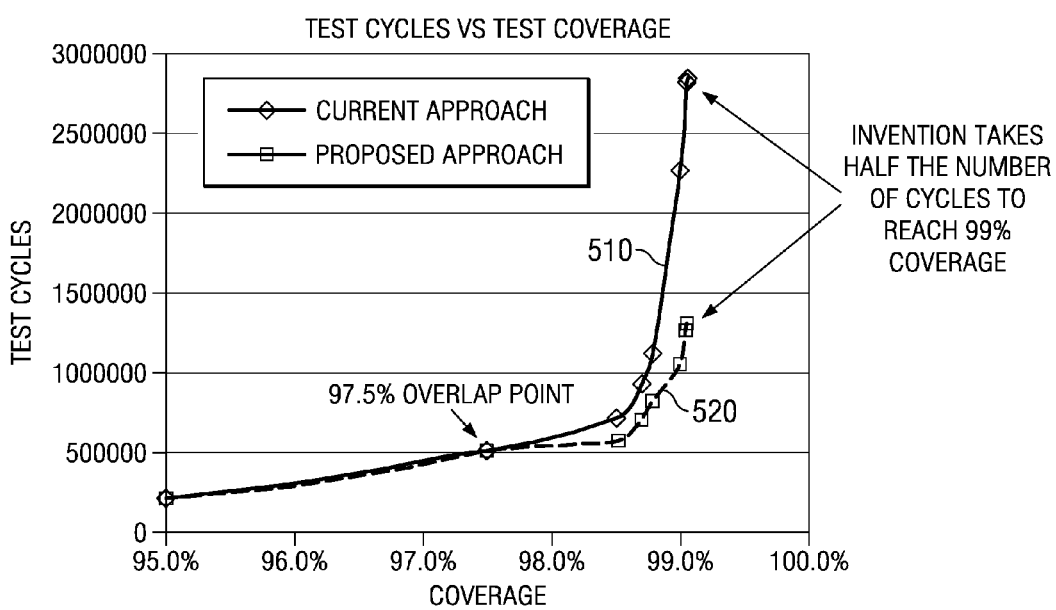
FIG. 5 is a graph illustrating a comparison of test cycles versus fault coverage for the first example design of the prior art of FIG. 1 and the invention of FIG. 4.

FIG. 5 illustrates graphs of test cycles versus fault coverage for the first example design comparing the prior art of FIG. 1 and the invention of FIG. 4. The prior art curve 510 and the inventive curve 520 are essentially the same up to the 97.5% fault coverage point obtained using the conventional high compression mode. This occurs at about 500,000 test cycles. After this overlap point, the inventive technique reaches the goal of 99% fault coverage for many fewer test cycles. The inventive technique reaches 99% fault coverage at about 125,000 test cycles while the prior art requires nearly 3,000,000 test cycle to reach 99% fault coverage.

The area overhead of this invention is minimal. The inventors estimate requiring an addition of only about 300 gates in designs with approximately 300,000 or more gates count. This additional gate count is independent of the design size. The additional gate count depends only on the number of internal scan chains.

Figure 6C:
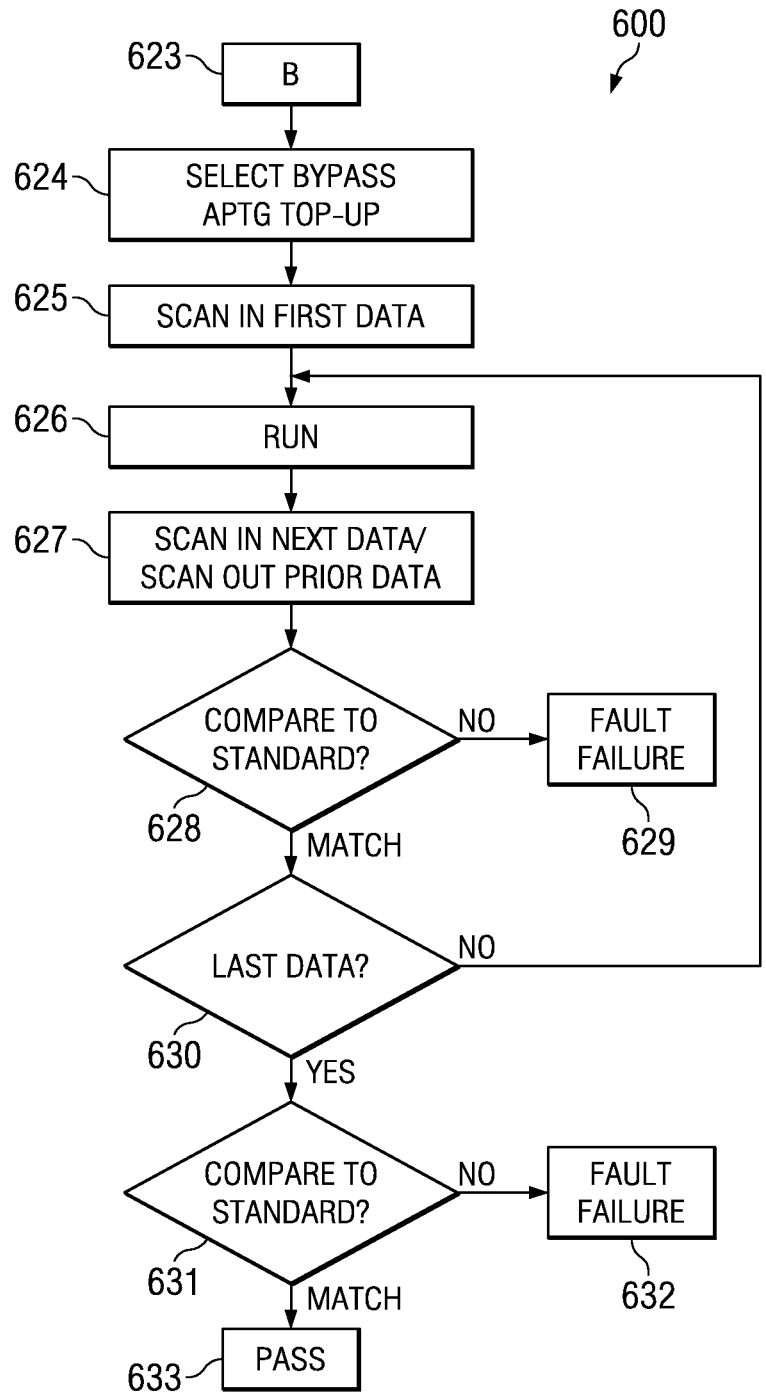

FIGS. 6A, 6B and 6C together illustrate process 600 of performing the test of this invention. Process 600 anticipates that test data for the circuit under test in the high compression mode, the low compression mode and the bypass mode are already written and stored in the tester. Process 600 also anticipates that comparison data for the various tests are stored in the tester.

Process 600 begins at start block 601. Process 600 first selects the high compression codec 421 at block 602. This selection is made via the test mode 432 and test mode2 433 illustrated in FIG. 4. Process 600 then scans in the first test data at block 603. This includes supplying data via chip level scan inputs 411 to coded 421 for decompression, then via glue logic 432 to the scan chains 431 of device under test 430.

Block 604 runs device under test 430. This could be for one or more machine cycles. This process generates new data in the registers that form scan chains 431. Block 605 scans in the next data as previously described and scans out the data resulting from running device under test in block 604. This scan out includes supply via glue logic 441 to coded 443 for compression and hence to the tester via chip level scan outputs 451. Note that each element in each scan chain is serially connected to the next element. Thus scanning in new data also scans out the previous device state.

Test block 606 compares the scanned out data to a standard. As noted above the tester already stores the expected results for the scan in/run cycle for the device under test 430. If this comparison finds no match (No at test block 606), the process 600 ends in fault failure block 607. Reaching block 607 indicates the particular device tested fails. This device is handled in a manner not relevant to this invention.

If test block 606 finds a match (Match at test block 606), the process 600 advances to test block 608. The device under test has passed this particular test and will continue to be tested. Test block 608 determines whether the previous data scanned out of the device under test 430 was the last data. If this was not the last data (No at test block 608), the process 600 returns to block 604 to run the device. Note the previous iteration of block 605 has already scanned in the next test data.

If the previous scanned out data was the last data (Yes at test block 608), then block 609 compares the last scanned out data to the corresponding standard at test block 609. If this comparison finds no match (No at test block 609), the process 600 ends in fault failure block 610. If test block 609 finds a match (Match at test block 609), then process 600 advances to block 611. Block 611 connects to block 612 in FIG. 6B to begin the process for low compression.

Process 600 begins low compression mode at block 612. Process 600 selects the low compression codec 422 at block 613. Process 600 then scans in the first test data for the low compression mode at block 614.

Block 616 runs device under test 430. Block 615 scans in the next data as previously described and scans out the data resulting from running device under test in block 604.

Test block 617 compares the scanned out data to a standard. If this comparison finds no match (No at test block 617), the process 600 ends in fault failure block 618. If test block 617 finds a match (Match at test block 617), the process 600 advances to test block 619. Test block 619 determines whether the previous data scanned in to the device under test 430 was the last data. If this was not the last data (No at test block 619), then process 600 returns to block 615 to run the device.

If the previous scanned in data was the last data (Yes at test block 619), then process 600 compares the last scanned out data to the corresponding standard at test block 620. If this comparison finds no match (No at test block 620), the process 600 ends in fault failure block 621. If test block 620 finds a match (Match at test block 620), then process 600 advances to block 622. Block 622 connects to block 613 in FIG. 6C to begin the process for bypass ATPG top-up.

Process 600 begins the bypass mode at block 623. Process 600 selects the bypass mode at block 624. Process 600 then scans in the first test data for the bypass mode at block 625.

Block 626 runs device under test 430. Block 627 scans in the next data as previously described and scans out the data resulting from running device under test in block 604.

Test block 628 compares the scanned out data to a standard. If this comparison finds no match (No at test block 628), the process 600 ends in fault failure block 629. If test block 628 finds a match (Match at test block 628), the process 600 advances to test block 630. Test block 630 determines whether the previous data scanned in to the device under test 430 was the last data. If this was not the last data (No at test block 630), then process 600 returns to block 626 to run the device.

If the previous scanned in data was the last data (Yes at test block 630), then process 600 compares the last scanned out data to the corresponding standard at test block 631. If this comparison finds no match (No at test block 631), the process 600 ends in fault failure block 632. If test block 631 finds a match (Match at test block 631), the process 600 advances to block 633 indicating that device under test 430 has passed.

Note that depending upon the fault coverage after the low compression mode, bypass ATPG top-up may not be needed. Thus process 600 would end at block 622 following the low compression mode. In addition, there may be more than one low compression mode, each supported by a decompression codec and a compression codec and including a process as illustrated in FIG. 6B.

The example embodiment illustrated in FIG. 4 included a plurality of two codecs for both decompression and compression. This number of codec for decompression and compression could easily be extended to three or more codecs. This extension would include provision of the additional codec, modification of glue logic 423 and 441 to select among the implemented plurality of codecs. Test mode2 433 could be modified with additional bits to select among the three or more decompression and compression codecs. The test flow illustrated in FIG. 6 would also be modified to include additional steps similar to steps 612 to 622 illustrated in FIG. 6B to perform tests using the additional codecs.

The invention reduces the test time and test data volume for low pin count devices, enabling high compression during multi-site testing. The invention overcomes the challenge of better compression with less test pins, enabling very high multi-sites. The invention adds very minimal area overhead, since it is based on DFTCMax compression solution which is purely combinational. The invention is not only applicable for low-pin count devices, but also for regular devices that target very high compression along with tighter coverage goals. The invention meets tighter coverage goals without compromising on test time/cost, and hence device COB for cost sensitive market segments.

The invention achieves these ends with little additional circuitry required in the device under test. This invention requires only an additional 2000 to 5000 gates in designs with approximately 300,000 or more overall gate count. This invention requires no scan re-stitching. The codec does the scan reconfiguring for the different compression modes. Accordingly there is almost no design change required to implement this invention.

What is claimed is:

1. An integrated circuit comprising:
   at least one scan input;
   a decompressor including
      a plurality of decompression codecs, each decompression codec having an input connected to said at least one scan input and an output generating decompressed data according to a codec parameter different from a codec parameter of every other of the plurality of decompression codecs, said plurality of decompression codecs include a high fault tolerant decompression codec having as said codec parameter a first decompression fault tolerance and a low fault tolerant decompression codec having as said codec parameter a second decompression fault tolerance lower than said first decompression fault tolerance;
   an operational circuit having a plurality of serial scan chains, each serial chain having inputs connected to a selected of one said plurality of decompression codecs and outputs;
   a compressor including
      a plurality of compression codecs, each compression codec having an input connected to said output of said plurality of serial scan chain and an output generating compressed data according to a codec parameter different from said codec parameter of every other of the plurality of compression codecs;
at least one scan output outputting data from a selected one of said plurality of compression codecs.

2. The integrated circuit of claim 1, wherein:
said decompressor further includes
   a first glue logic connected to said plurality of decompression codecs for connecting as selected one of said plurality of decompression codecs to said plurality of serial scan chains; and
said compressor further includes
   a second glue logic connected to said plurality of compression codecs for connecting said plurality of serial scan chains to said selected one of said compression codecs.

3. The integrated circuit of claim 2, wherein:
said first glue logic includes a bypass mode connecting said at least one scan input to said inputs of said plurality of serial scan chains; and
said second glue logic includes a bypass mode connecting said outputs of said plurality of serial scan chains to said at least one scan output.

4. The integrated circuit of claim 3, further comprising:
a first test mode input connected to said first and second glue logic for selecting one of said decompression codecs and a corresponding compression codec or said bypass mode; and
a second test mode input connected to said first and second glue logic for selecting one of said decompression codecs and a corresponding one of said compression codecs.

5. The integrated circuit of claim 1, wherein:
said plurality of compression codecs include a high fault tolerant compression codec having as said codec parameter a first compression fault tolerance corresponding to said first decompression fault tolerance and a low fault tolerant compression codec having as said codec parameter a second compression fault tolerance corresponding to said second decompression fault tolerance.

6. An integrated circuit comprising:
at least one scan input;
a decompressor including
   a plurality of decompression codecs, each decompression codec having an input connected to said at least one scan input and an output generating decompressed data according to a codec parameter different from a codec parameter of every other of the plurality of decompression codecs, said plurality of decompression codecs include a first decompression codec having as said codec parameter a combinational codec and a second decompression codec having as said codec a sequential codec;
an operational circuit having a plurality of serial scan chains, each serial chain having inputs connected to a selected of one said plurality of decompression codecs and outputs;
a compressor including
   a plurality of compression codecs, each compression codec having an input connected to said output of said plurality of serial scan chain and an output generating compressed data according to a codec parameter different from said codec parameter of every other of the plurality of compression codecs;
at least one scan output outputting data from a selected one of said plurality of compression codecs.

7. The integrated circuit of claim 6, wherein:
said plurality of compression codecs include a first compression codec having as said codec parameter a combinational codec and a second compression codec having as said codec parameter sequential codec.

8. A method of testing an integrated circuit comprising the steps of:
scanning test data into the integrated circuit via scan inputs;
a plurality of iterations of
   decompressing the test data into decompressed data employing corresponding unique decompression codec parameters,
   scanning decompressed data into inputs of plural serial scan chains in the integrated circuit,
   running the integrated circuit for a predetermined number of machine cycles,
   scanning data out of outputs of the plural serial scan chains,
   compressing scanned out data into compressed scanned out data employing unique compression codec parameters,
   comparing the compressed scanned out data to a corresponding standard;
said plurality of iterations comprises two iterations including
   a first iteration wherein the decompression codec has as said codec parameter a first fault tolerance and the compression codec has as said codec parameter a corresponding first fault tolerance, and
   a second iteration wherein the decompression codec has as said codec parameter a second fault tolerance lower than the first fault tolerance and the compression codec has as said codec parameter a corresponding second fault tolerance lower than the first fault tolerance; and
stopping testing if said compressed scanned out data does not match said corresponding standard.

9. The method of claim 8, further comprising the steps of:
scanning test data into the integrated circuit via scan inputs;
scanning data into inputs of plural serial scan chains in the integrated circuit;
running the integrated circuit for a predetermined number of machine cycles;
scanning data out of outputs of the plural serial scan chains;
scanning data out of the integrated circuit via scan outputs;
comparing the scanned out data to a corresponding standard;
stopping testing if said scanned out data does not match said corresponding standard.

10. A method of testing an integrated circuit comprising the steps of:
scanning test data into the integrated circuit via scan inputs;
a plurality of iterations of
   decompressing the test data into decompressed data employing corresponding unique decompression codec parameters,
   scanning decompressed data into inputs of plural serial scan chains in the integrated circuit,
   running the integrated circuit for a predetermined number of machine cycles,
   scanning data out of outputs of the plural serial scan chains,
   compressing scanned out data into compressed scanned out data employing unique compression codec parameters,
   comparing the compressed scanned out data to a corresponding standard;

said plurality of iterations comprises two iterations including
- a first iteration wherein the decompression codec has as said codec parameter a combinational codec and the compression codec has as said codec parameter a corresponding combinational codec, and
- a second iteration wherein the decompression codec has as said codec parameter a sequential codec and the compression codec has as said codec parameter a corresponding sequential codec; and stopping testing if said compressed scanned out data does not match said corresponding standard.

11. The integrated circuit of claim 6, wherein:
said decompressor further includes
- a first glue logic connected to said plurality of decompression codecs for connecting as selected one of said plurality of decompression codecs to said plurality of serial scan chains; and said compressor further includes
- a second glue logic connected to said plurality of compression codecs for connecting said plurality of serial scan chains to said selected one of said compression codecs.

12. The integrated circuit of claim 11, wherein:
said first glue logic includes a bypass mode connecting said at least one scan input to said inputs of said plurality of serial scan chains; and
said second glue logic includes a bypass mode connecting said outputs of said plurality of serial scan chains to said at least one scan output.

13. The integrated circuit of claim 12, further comprising:
- a first test mode input connected to said first and second glue logic for selecting one of said decompression codecs and a corresponding compression codec or said bypass mode; and
- a second test mode input connected to said first and second glue logic for selecting one of said decompression codecs and a corresponding one of said compression codecs.

14. The method of claim 10, further comprising the steps of:
scanning test data into the integrated circuit via scan inputs;
scanning data into inputs of plural serial scan chains in the integrated circuit;
running the integrated circuit for a predetermined number of machine cycles;
scanning data out of outputs of the plural serial scan chains;
scanning data out of the integrated circuit via scan outputs;
comparing the scanned out data to a corresponding standard;
stopping testing if said scanned out data does not match said corresponding standard.

* * * * *